United States Patent
Lombard et al.

(10) Patent No.: US 8,503,225 B2
(45) Date of Patent: Aug. 6, 2013

(54) MULTIBIT CELL WITH SYNTHETIC STORAGE LAYER

(75) Inventors: Lucien Lombard, Grenoble (FR); Ioan Lucian Prejbeanu, Seyssinet Pariset (FR)

(73) Assignee: Crocus-Technology SA, Grenoble Cedex (FR)

( * ) Notice: Subject to any disclaimer, the term of this patent is extended or adjusted under 35 U.S.C. 154(b) by 0 days.

(21) Appl. No.: 13/475,215

(22) Filed: May 18, 2012

(65) Prior Publication Data

US 2012/0300539 A1 Nov. 29, 2012

(30) Foreign Application Priority Data

May 23, 2011 (EP) .................................... 11290239

(51) Int. Cl.
*G11C 11/00* (2006.01)

(52) U.S. Cl.
USPC ........... 365/158; 365/148; 365/171; 977/933; 977/935

(58) Field of Classification Search
USPC .................. 365/48, 55, 62, 66, 74, 78, 80–93, 365/100, 130, 131, 148, 158, 171–173, 225.5, 365/243.5; 216/22; 257/421, E21.665; 428/810–816, 817–825.1, 826; 438/3; 977/933–935
See application file for complete search history.

(56) References Cited

U.S. PATENT DOCUMENTS

| | | | |
|---|---|---|---|
| 5,640,343 | A | 6/1997 | Gallagher et al. |
| 6,950,335 | B2 | 9/2005 | Dieny et al. |
| 2005/0105355 | A1 | 5/2005 | Brueckl et al. |
| 2009/0010088 | A1 | 1/2009 | Chen et al. |
| 2009/0073748 | A1 | 3/2009 | Klostermann |
| 2012/0120720 | A1 * | 5/2012 | Cambou ....................... 365/158 |

FOREIGN PATENT DOCUMENTS

| | | |
|---|---|---|
| EP | 2276034 A2 | 1/2011 |
| WO | 03021689 A1 | 3/2003 |

OTHER PUBLICATIONS

European search report for EP 11 29 0239 dated Oct. 10, 2011.

* cited by examiner

*Primary Examiner* — Harry W Byrne
(74) *Attorney, Agent, or Firm* — Pearne & Gordon LLP

(57) ABSTRACT

Method for writing and reading more than two data bits to a MRAM cell comprising a magnetic tunnel junction formed from a read magnetic layer having a read magnetization, and a storage layer comprising a first storage ferromagnetic layer having a first storage magnetization, a second storage ferromagnetic layer having a second storage magnetization; the method comprising: heating the magnetic tunnel junction above a high temperature threshold; and orienting the first storage magnetization at an angle with respect to the second storage magnetization such that the magnetic tunnel junction reaches a resistance state level determined by the orientation of the first storage magnetization relative to that of the read magnetization. The method allows for storing at least four distinct state levels in the MRAM cell using only one current line to generate a writing field.

15 Claims, 7 Drawing Sheets

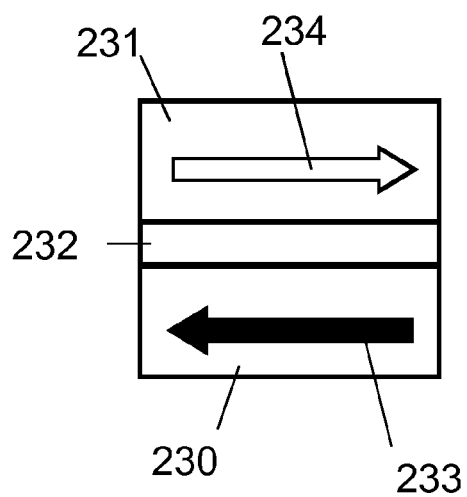 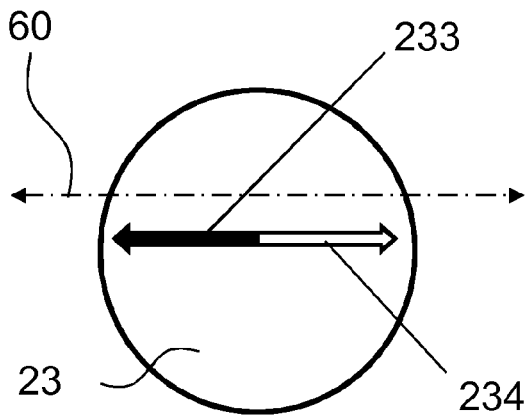
Fig. 2          Fig. 3
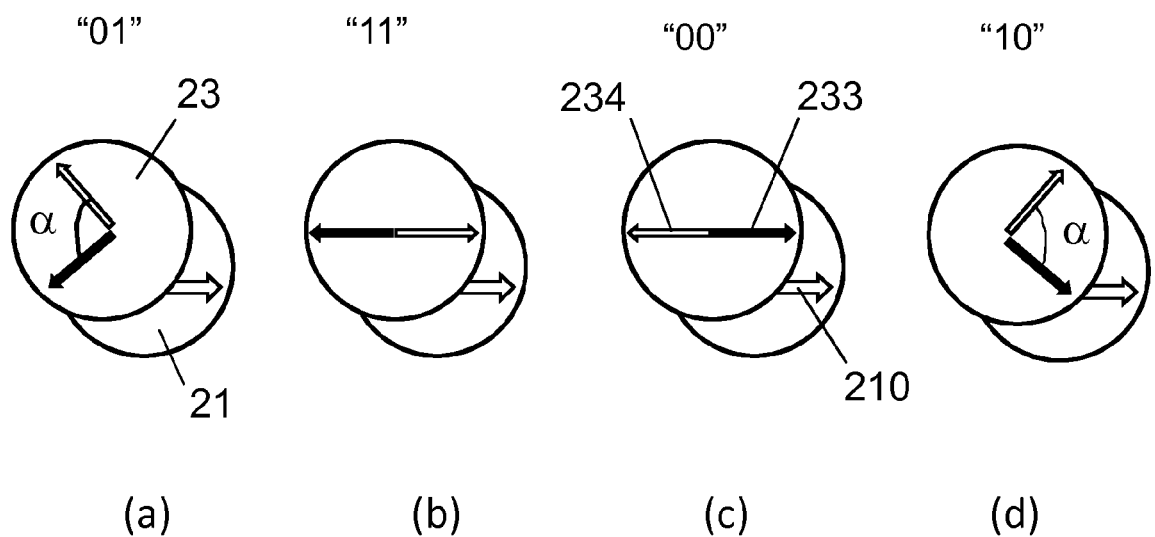
(a)   (b)   (c)   (d)
Fig. 4

MULTIBIT CELL WITH SYNTHETIC STORAGE LAYER

FIELD

The present invention concerns a method for writing to a plurality of data bits in a magnetic random access memory (MRAM) cell.

DESCRIPTION OF RELATED ART

Memory devices that employ variable resistance materials include resistive random access memories (RRAM), phase change random access memories (PRAM), ferroelectric random access memories (FRAM), magnetic random access memories (MRAM), etc. The nonvolatile memory devices listed above may store data based on a variation in the resistance of a variable resistance material (RRAM), a phase change material having amorphous and crystalline states (PRAM), a ferroelectric material having different polarization states (FRAM), and/or a magnetic tunnel junction film of a ferroelectric material having different magnetized states (MRAM).

Devices based on MRAM have experiencing a renewed interest since magnetic tunnel junctions demonstrated a strong magnetoresistance at ambient temperature. MRAM present many advantages such as high writing and reading speeds (down to a few nanoseconds) non volatility, and insensitivity to ionizing radiations. MRAM comprising a so-called "magnetoresistance effect" or GMR have been first proposed. Such MRAMs were made by stacking several metal layers being alternatively magnetic and nonmagnetic. The GMR element disadvantageously requires large magnetic fields to be applied and thus requires large currents for writing and reading information.

The development of MRAM cells with a magnetic tunnel junction has allowed a significant increase in the performances and operating mode of these MRAMs. Such MRAM cells are described in U.S. Pat. No. 5,640,343. Such MRAM cell typically comprises a magnetic tunnel junction having a tunneling barrier layer between a first ferromagnetic layer and a second ferromagnetic layer. The magnetic tunnel junction is electrically connected at one end to a first current line and, to its other end, to a selection CMOS transistor. The MRAM cell further comprises a second current line disposed orthogonal to the first current line.

The first and second ferromagnetic layers typically have different coercivities and are preferentially made from 3d metals such as Fe, Co, Ni, and their alloys, possibly containing boron in order to amorphize the ferromagnetic layers and to flatten their interfaces. The tunneling barrier layer is typically a thin insulating layer of alumina ($Al_2O_3$) or MgO. Each ferromagnetic layer can be coupled with an anti-ferromagnetic layer (not shown), whose function is to trap the ferromagnetic layer it couples, so that the magnetization of the coupled ferromagnetic layer is pinned and cannot rotate freely.

During a write operation of the conventional MRAM cell, the selection transistor is set in a blocked mode such that no current passes through the magnetic tunnel junction. A first field current is passed in the first current line generating a first magnetic field, and a second field current is passed in the second current line generating a second magnetic field. The first and second magnetic fields are adapted such as to switch the magnetization direction of the second magnetic layer, thus writing the MRAM cell. In an array comprising a plurality of the MRAM cell, only the cell 1 being located at the intersection of the first and second current line is being written, or addressed, under the effect of the combined first and second magnetic fields. The write operation is then selective.

During a read operation, a read current is selectively passed through the magnetic tunnel junction of the written cell by setting the selection transistor of this cell 1 in the saturated mode such as to measure a junction resistance of the magnetic tunnel junction. The magnetoresistance of the MRAM cell 1 can be determined by comparing the measured junction resistance with a reference resistance measured for a reference MRAM cell. A low measured junction resistance (or level state "0") corresponds to the magnetization direction of the second ferromagnetic layer being oriented parallel to the magnetization direction of the first ferromagnetic layer, while a high measured junction resistance (or level state "1") corresponds to the magnetization direction of the second ferromagnetic layer being oriented antiparallel to the magnetization direction of the first ferromagnetic layer. The difference between the value of the high and low junction resistance, or the tunnel magnetoresistance, depends on the material composing the ferromagnetic layers and possibly on heat treatment performed on these ferromagnetic layers. A tunnel magnetoresistance of more than 70% can be reached with a suitable choice of materials and/or heat treatment.

MRAM cells with a multilevel state write operation has also been proposed, allowing for writing more than the two level states "0" and "1" as described above. Such a MRAM cell with a multilevel state write operation is disclosed in U.S. Pat. No. 6,950,335. Here, the magnetization of the second ferromagnetic layer, or storage layer, can be oriented in any intermediate direction between the direction parallel and the direction antiparallel to the magnetization direction of the first ferromagnetic layer, or reference layer. Orienting the magnetization of the storage layer in the intermediate directions can be achieved by generating magnetic fields with appropriate relative intensity along the perpendicular directions of the first and second current line.

US 2009073748 discloses an integrated circuit having a magnetic random access memory cell is provided. The magnetic random access memory cell may include a reference layer structure being polarized in a first direction, a free layer structure including at least two anti-parallel coupled ferromagnetic layers and having an anisotropy in an axis parallel to the first direction, at least one of the at least two anti-parallel coupled ferromagnetic layers being made of a material having a temperature dependent saturation magnetization moment, and a non-magnetic tunnel barrier layer structure being disposed between the reference layer structure and the free layer structure.

SUMMARY

The present disclosure describes a method for writing and reading more than two data bits to a magnetic random access memory (MRAM) cell that can comprise a magnetic tunnel junction formed from a read magnetic layer having a read magnetization, a tunnel barrier layer, and a storage layer that can be freely oriented at a high temperature threshold; the storage layer comprising a first storage ferromagnetic layer having a first storage magnetization, a second storage ferromagnetic layer having a second storage magnetization, and a storage anti-parallel coupling layer magnetically coupling the first and second storage magnetization; the method comprising:

heating the magnetic tunnel junction at the high temperature threshold;

orienting the first and second storage magnetization; and cooling the magnetic tunnel junction to a low temperature threshold to freeze the first storage magnetization; wherein said orienting the first and second storage magnetization comprises the first storage magnetization forming a predetermined angle with respect to the second storage magnetization such as to reach a predetermined resistance state level of the magnetic tunnel junction determined by the orientation of the first and second storage magnetization relative to the read magnetization; and wherein cooling the magnetic tunnel junction comprises freezing the second storage magnetization at the predetermined angle.

In an embodiment, orienting the first and second storage magnetization can comprise applying an external magnetic field by passing a field current in the current line, the predetermined angle being determined according to the magnitude and direction of the magnetic field.

In another embodiment, applying an external magnetic field can be performed substantially parallel to the anisotropy axis of the first and second storage magnetization.

In yet another embodiment, said magnitude of the magnetic field can be below a spin-flop value or equal or exceeding the spin-flop value.

In yet another embodiment, applying an external magnetic field can be performed substantially orthogonal to the anisotropy axis of the first and second storage magnetization.

In yet another embodiment, said magnitude of the magnetic field can be varied from a saturation value of the first and second storage magnetization, and below.

In yet another embodiment, the magnetic tunnel junction can further comprise an antiferromagnetic storage layer adapted to pin the first and second storage magnetization at the low temperature threshold.

In yet another embodiment, the read magnetization of the read layer can be fixed relative to the storage magnetization direction; and can further comprise passing a read current through the magnetic tunnel junction to measure a junction resistance of the magnetic tunnel junction.

In yet another embodiment, the magnetic tunnel junction can further comprise an antiferromagnetic read layer pinning the read magnetization.

In yet another embodiment, the read magnetization of the read layer can have a direction that can be varied freely; the method can further comprise aligning the read magnetization in a first aligned direction such as to measure a first junction resistance of the magnetic tunnel junction; aligning the read magnetization in a second aligned direction such as to measure a second junction resistance of the magnetic tunnel junction; and determining a difference between the first and second junction resistance.

In yet another embodiment, aligning the read magnetization in a first aligned direction can comprise passing a first read current having a first polarity in the current line; and aligning the read magnetization in a second aligned direction can comprise passing a second read current having a second polarity in the current line.

In yet another embodiment, the first storage ferromagnetic layer and the second storage ferromagnetic layer can be made from a CoFe, CoFeB or NiFe alloy and the storage anti-parallel coupling layer can be made from a non-magnetic layer with material selected from a group consisting of ruthenium, chromium, rhenium, iridium, rhodium, silver, copper and yttrium.

In yet another embodiment, wherein the first and second storage ferromagnetic layer can have a thickness comprised between about 1.5 nm and about 4 nm.

In yet another embodiment, the storage anti-parallel coupling layer can be made of ruthenium and can have a thickness comprised between about 0.6 nm and about 2 nm, preferably between about 0.6 nm and about 0.9 nm or between about 1.6 nm and about 2 nm.

In yet another embodiment, the saturation field value of the first and second storage magnetization can be varied by varying thickness of the storage anti-parallel coupling layer or by varying thickness of the first and second storage layer.

The method disclosed herein allows for storing at least four distinct state levels in the MRAM cell. The writing operation can be performed with the MRAM cell comprising only one current line for generating a single magnetic field. Another current line, typically disposed orthogonal with the current line as in most conventional MRAM cells is not needed.

BRIEF DESCRIPTION OF THE DRAWINGS

The invention will be better understood with the aid of the description of an embodiment given by way of example and illustrated by the figures, in which:

FIGS. 2 and 3 represent a schematic cross-section of the storage layer viewed from the side (FIG. 2) and from top (FIG. 3), according to an embodiment;

FIGS. 4a to 4d illustrate arrangements of the first and second storage layers in the presence of an external magnetic field and when heating the magnetic tunnel junction, according to an embodiment;

DETAILED DESCRIPTION OF POSSIBLE EMBODIMENTS

Figure 1:
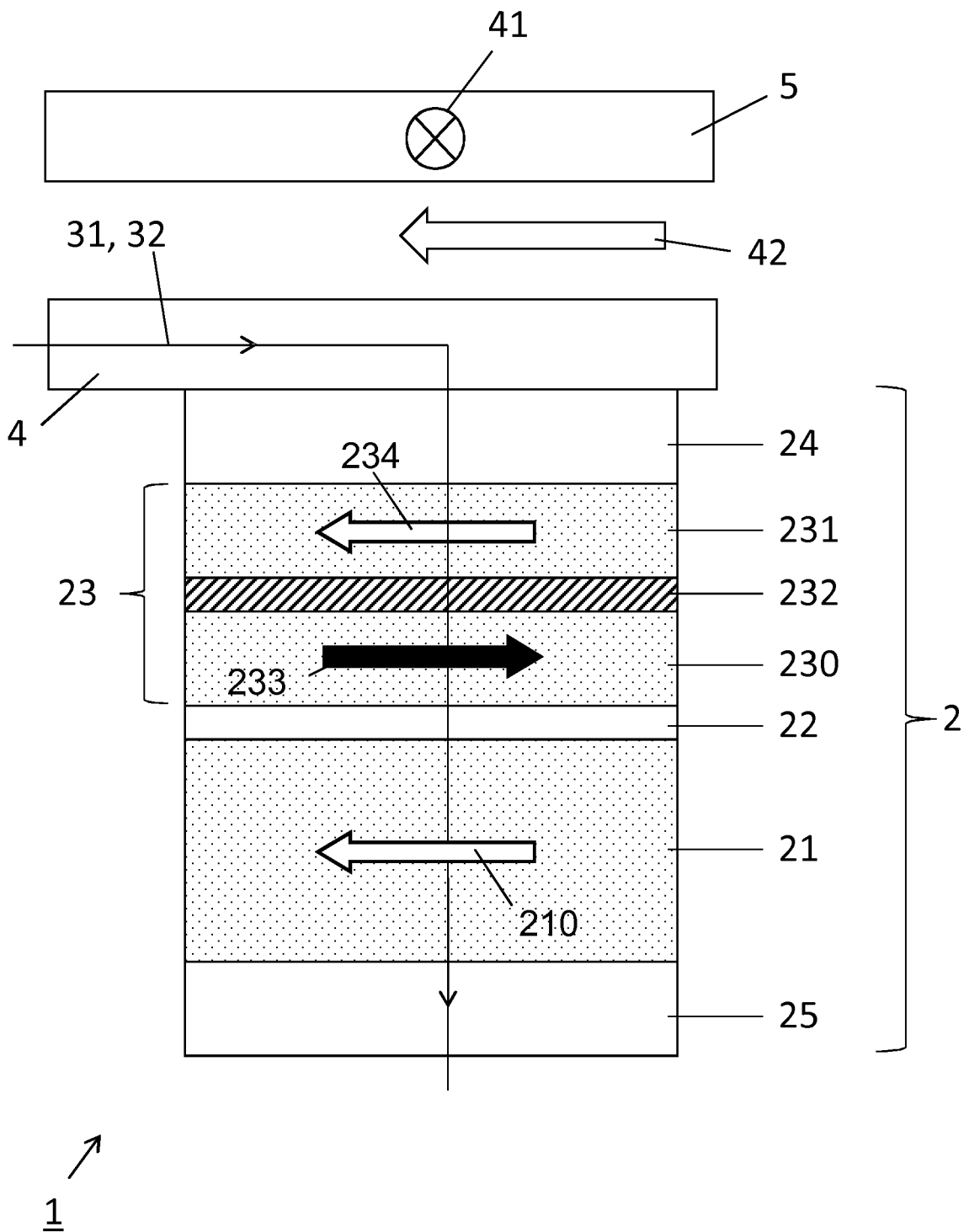
FIG. 1 represents a magnetic random access memory (MRAM) cell comprising a magnetic tunnel junction formed from a read magnetic layer, a tunnel barrier layer, and a storage layer, according to an embodiment.

FIG. 1 represents a magnetic random access memory (MRAM) cell 1 comprising a magnetic tunnel junction 2 formed from a read magnetic layer 21 having a read magnetization direction 210, a tunnel barrier layer 22, and a storage layer 23 having a storage magnetization direction 233, 234. A first current line 4 in electrical communication with the magnetic tunnel junction 2 is disposed at one end of the magnetic tunnel junction 2 and is arranged to provide a heating current 31 in the magnetic tunnel junction 2. The MRAM cell 1 can further comprise a second current line 5 adapted to pass a field current 41 such as to generate a magnetic field 42. In the example of FIG. 1, the second current line 5 is disposed at the same end of the magnetic tunnel junction 2 as the first current line 4, but could also be disposed on the opposite end. Alternatively, the first current line 4 can fulfill both the function of passing the heating current 31 and the function of passing the field current 41.

In the embodiment of FIG. 1, the storage layer 23 is represented by a synthetic storage layer comprising a first storage ferromagnetic layer 230 having a first storage magnetization 233, and a second storage ferromagnetic layer 231 having a second storage magnetization 234. The magnetization of the two storage ferromagnetic layers 233, 234 is coupled in an anti-parallel direction due to the presence of a storage anti-parallel coupling layer 232. The storage layer 23 comprising the two storage ferromagnetic layers 230, 231 and the storage anti-parallel coupling layer 232 will be referred to as a synthetic antiferromagnet or "SAF" storage layer 23. The two storage ferromagnetic layers 230, 231 can be made of a CoFe, CoFeB or NiFe alloy and have a thickness typically comprised between about 1.5 nm and about 4 nm. The storage anti-parallel coupling layer 232 can be realized using a non-magnetic separating layer with material selected from a group consisting of ruthenium, chromium, rhenium, iridium, rhodium, silver, copper and yttrium. Preferably, the storage anti-parallel coupling layer 232 is made of ruthenium and has a thickness typically comprised between about 0.6 nm and 2 nm, preferably between 0.6 nm and about 0.9 nm or between about 1.6 nm and about 2 nm.

In an embodiment, the read magnetization 210 of the read layer 21 is fixed relative to the first and second storage magnetization 233, 234. Such read layer is also called reference layer. Although not represented in FIG. 1, the read layer 21 can also be a synthetic antiferromagnetic read layer comprising a first read ferromagnetic layer and a second read ferromagnetic layer, the two reference ferromagnetic layers being coupled in an anti-parallel direction with a read anti-parallel coupling layer. In this configuration, the first read ferromagnetic layer, in contact with the tunnel barrier layer 22, can be made of a CoFeB alloy while the second read ferromagnetic layer can be made of a CoFe alloy. The second read ferromagnetic layers can have a thickness typically comprised between about 1 nm and about 4 nm. The read anti-parallel coupling layer can be made of Ru and have a thickness typically comprised between about 0.6 nm and about 2 nm, preferably between about 0.6 nm and about 0.9 nm or between about 1.6 nm and about 2 nm.

In an embodiment, the magnetic tunnel junction 2 further comprises an antiferromagnetic read layer 25 pinning the read magnetization 210, such that the read magnetization 210 of the read layer 21 is fixed relative to the first and second storage magnetization 233, 234. The antiferromagnetic read layer 25 is preferably disposed adjacent to the read layer 21 on its side opposed to the tunnel barrier layer 22. The antiferromagnetic read layer 25 is preferably formed of a Mn based alloy, for example, comprising one of PtMn, NiMn, IrMn and FeMn, and is arranged such as to pin the read magnetization 210.

The tunnel barrier layer 22 can be an insulating layer, for example, made from an oxide selected in the group including among others aluminum oxides $Al_2O_3$ and magnesium oxides MgO.

According to an embodiment, the SAF storage layer 23 has its magnetization direction 233, 234 being adjustable in a reversible manner during a write operation. The write operation can comprise passing the field current 41 in the second current line 5 (or in the first current line 4) such as to generate an external magnetic field 42 adapted to align the storage magnetization 233, 234 according to the magnitude and polarity of the field current 41. In the example of FIG. 1, the field current 41 is shown pointing within the page and the magnetic field 42 is represented by the arrow pointing toward the left.

In an embodiment, the write operation also comprises a step of heating the magnetic tunnel junction 2, for example, by passing the heating current 31 through the magnetic tunnel junction 2 via the first current line 4. The MRAM cell 1 can further comprises a selection transistor (not represented) such that the heating current 31 is passed when the selection transistor is in a saturated mode. During the write operation, the second storage magnetization 234 is aligned in the external magnetic field 42 once the magnetic tunnel junction 2 has reached a predetermined high temperature threshold. The first storage magnetization 233 is oriented in accordance with its coupling with the second storage layer magnetization 234 through the anti-parallel coupling layer 232. The magnetic tunnel junction 2 is then cooled to a low temperature threshold at which the second storage magnetization 234 is frozen in its written state. This can be performed with the selection transistor being in the blocked mode such that the field current does not pass through the magnetic tunnel junction 2. Such a thermally-assisted switching write operation is described in more details in U.S. Pat. No. 6,950,335.

In the example of FIG. 1, the magnetic tunnel junction 2 further comprises an antiferromagnetic storage layer 24 adjacent to the SAF storage layer 23 on its side opposed to the tunnel barrier layer 22. The antiferromagnetic storage layer 24 is adapted to exchange-couple the SAF storage layer 23 such as to pin, or fix, the second storage magnetization 234 at a temperature at the low temperature threshold. At the high temperature threshold the second storage magnetization 234 is no longer pinned by antiferromagnetic storage layer 24 and can be freely adjusted under the external magnetic field 42. The antiferromagnetic storage layer 24 can be made of a manganese-based alloy, such as IrMn or FeMn, or any other suitable materials. The high temperature threshold is typically at or above a temperature of about 150° C.

FIGS. 2 and 3 represent a schematic cross-section of the SAF storage layer 23 with the first and second storage ferromagnetic layer 230, 231 viewed from the side (FIG. 2) and from top (FIG. 3), according to an embodiment. More particularly, the first storage magnetization 233 is represented oriented antiparallel with the second storage magnetization 234 due to the magnetic coupling of the two storage magnetizations 233, 234 through the storage anti-parallel coupling layer 232. In the example of FIGS. 2 and 3, the first and second storage magnetization 233, 234 are aligned substantially parallel with an anisotropy axis 60 corresponding to the easy axis of the first and second storage ferromagnetic layer 230, 231.

Figure 6:
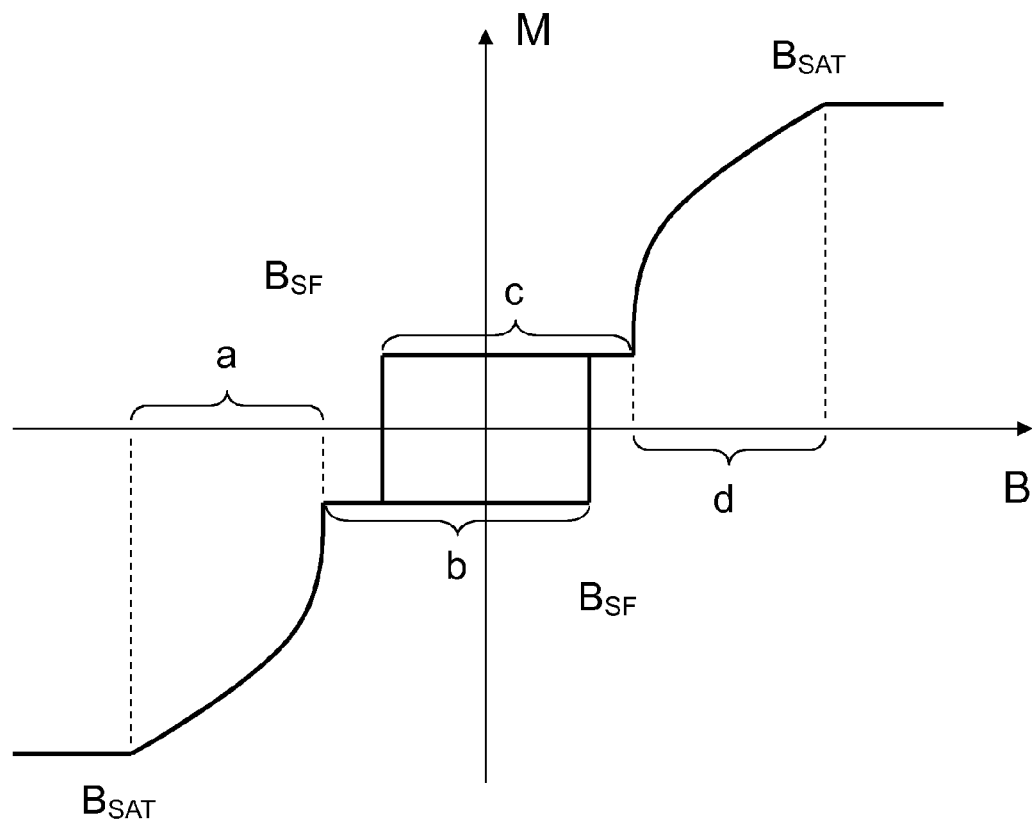
FIG. 6 represents a magnetization curve of the storage layer according to an embodiment.

FIG. 6 represents a magnetization curve of the SAF storage layer 23 comprising the first and second storage ferromagnetic layer 230, 231 for the case where the external magnetic field 42 is applied along the anisotropy axis 60. Symbol B denote the magnitude of the magnetic field 42 and symbol M denotes the magnetization values of the first and second storage magnetization 233, 234. The magnetization curve shows a hysteresis loop delimited by spin-flop value $B_{SF}$ of the magnetic field 42. When the magnitude of the magnetic field 42 is increased above a value corresponding to the spin-flop value $B_{SF}$, the first storage magnetization 233 is no more antiparallel with the second storage magnetization but forms a predetermined angle α with the second storage magnetization (see FIGS. 4a and 4b). When the magnetic field is further increased, the first storage magnetization 233 becomes oriented substantially parallel to the second storage magnetization 234. The magnitude of the magnetic field 42 required to orients the first storage magnetization 233 substantially parallel to the second storage magnetization 234 is referred to as the saturation magnetic field $B_{SAT}$.

FIGS. 4a to d illustrate arrangements of the first and second storage magnetization 233, 234 when the external magnetic field 42 is applied along the anisotropy axis 60, and the magnetic tunnel junction 2 is heated at the predetermined high temperature threshold. The read layer 21 is also represented in FIGS. 4a to d by the offset circle showing the corresponding read magnetization 210. It is assumed that the second storage magnetization 234 has a greater magnitude and is thus oriented with the magnetic field 42, while the first storage magnetization 233 is oriented due to the coupling effect of the coupling layer 232. FIGS. 5a to 5d illustrate arrangements of the first and second storage magnetization 233, 234 after cooling the magnetic tunnel junction 2 to the low temperature threshold and in the absence of the applied external magnetic field 42.

Figure 5:
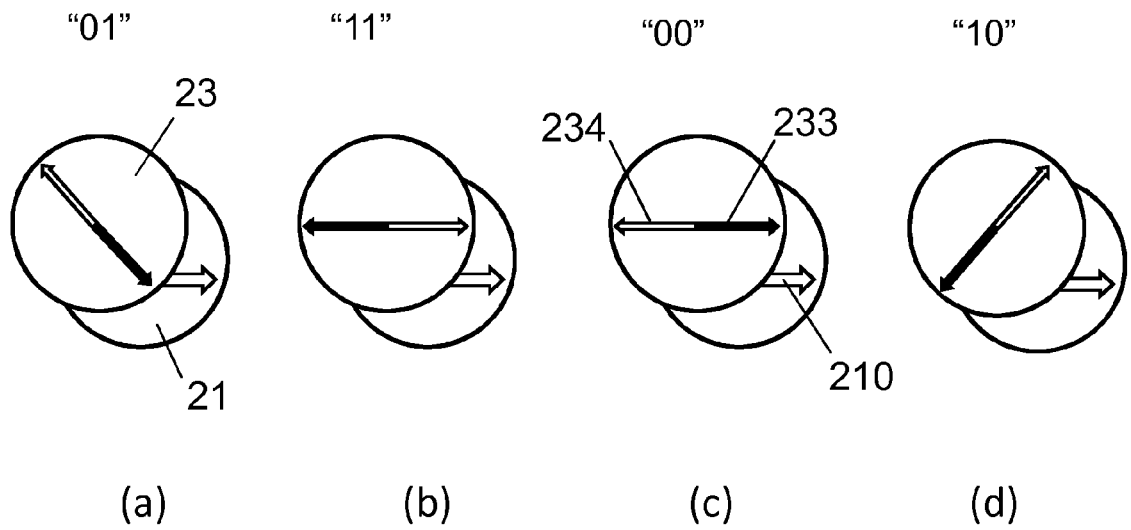
FIGS. 5a to 5d illustrate arrangements of the first and second storage magnetization in the absence of the magnetic field and after cooling the magnetic tunnel junction, according to an embodiment.

In FIGS. 4b and c the magnetic field 42 is applied with a magnitude that is below a spin-flop value $B_{SF}$ of the first and second storage magnetization 233, 234, shown by the portions b and c of the magnetization curve of FIG. 6, respectively. More particularly, in FIG. 4b the magnetic field 42 is applied in the same direction as the one of the read magnetization 210 and orients the second storage magnetization 234 substantially parallel with the read magnetization 210. The first storage magnetization 233 becomes oriented substantially antiparallel with the read magnetization 210 due to the coupling effect of the coupling layer 232. After cooling the magnetic tunnel junction 2 and in the absence of the applied external magnetic field 42, the arrangement of the first and second storage magnetization 233, 234 remains unchanged (FIG. 5b). This arrangement corresponds to a high magnetoresistance of the tunnel magnetic junction 2 and to a predetermined state level, for example a first state level indicated by the numeral "11" in FIG. 5b. In FIG. 4c, the magnetic field 42 is oriented in a direction opposite to the one of the example of FIG. 4b, such that the first storage magnetization 233 becomes oriented substantially parallel with the read magnetization 210. This corresponds to a low magnetoresistance of the tunnel magnetic junction 2 and to a second state level indicated by the numeral "00" in FIG. 5c.

In FIGS. 4a and d the magnetic field 42 is applied with a magnitude that is equal or exceeds the spin-flop value $B_{SF}$, shown by the portions a and d of the magnetization curve of FIG. 6, respectively. Here, the second storage magnetization 234 is oriented with the magnetic field 42 and form a predetermined angle α with the first storage magnetization 233 through the storage anti-parallel coupling layer 232. The predetermined angle α is maximal when the magnitude of the magnetic field 42 corresponds to the spin-flop value $B_{SF}$, and diminishes when the magnitude of the magnetic field 42 exceeds the spin-flop value $B_{SF}$. The first and second storage magnetization 233, 234 become substantially parallel when the magnetic field 42 is applied at the saturation value $B_{SAT}$.

More particularly, in the example of the FIG. 4a the second storage magnetization 234 is oriented with the magnetic field 42 having a magnitude being above the spin-flop value $B_{SF}$ and below the saturation value $B_{SAT}$, and in a direction opposed to the one of the read magnetization 210 (portion a of the magnetization curve of FIG. 6). Here, the magnetic field 42 orients the first and second storage magnetization 233, 234 at an angle of about 180°−α/2 with the read magnetization 210. After the magnetic tunnel junction 2 has been cooled to the low temperature threshold and in the absence of the applied external magnetic field 42, the orientation of the second storage magnetization 234 remains unchanged while the first storage magnetization 233 becomes oriented antiparallel with the second storage magnetization 234, thus making an angle α/2 with the read magnetization 210 (FIG. 5a). This arrangement corresponds to a first intermediate value of the magnetoresistance of the tunnel magnetic junction 2 and to a third state level indicated by the numeral "01" in FIG. 5a.

In the example of the FIG. 4d, the second storage magnetization 234 is also oriented with the magnetic field 42 having a magnitude being above the spin-flop value $B_{SF}$ and below the saturation value $B_{SAT}$, but in the same direction as the one of the read magnetization 210 (portion d of the magnetization curve of FIG. 6). In this case, the magnetic field 42 orients the first and second storage magnetization 233, 234 at an angle of about α/2 with the read magnetization 210. After the magnetic tunnel junction 2 has been cooled to the low temperature threshold and in the absence of the applied external magnetic field 42, the orientation of the first storage magnetization 233 becomes oriented antiparallel with the second storage magnetization 234 making an angle of 180°−α/2 with the read magnetization 210 (FIG. 5d). This arrangement corresponds to a second intermediate value of the magnetoresistance of the tunnel magnetic junction 2 and to a fourth state level indicated by the numeral "10" in FIG. 5d.

The method disclosed herein allows for storing at least four distinct state levels in the MRAM cell 1 by applying the magnetic field 42 in two opposite directions and a magnitude below the spin-flop value $B_{SF}$ of the first and second storage magnetization 233, 234, and with a magnitude at and above the spin-flop value $B_{SF}$.

The step of heating the magnetic tunnel junction 2 when performing the write operation as described above allows for writing the different state levels using only the second current line 5 to generate a magnetic field. Another current line, typically disposed orthogonal with the second current line 5 as in most conventional MRAM cells is therefore not needed. Moreover, in the case the first current line 4 fulfills both the function of passing the heating current 31 and the function of passing the field current 41, only the first current line 4 is required for writing the different state levels to the MRAM cell 1.

As known in the art, the strength of the magnetic coupling within the SAF storage layer 23 depends on the thickness of the nonmagnetic storage anti-parallel coupling layer 232. Consequently, a larger angle α can then be obtained when the magnetic field 42 is applied with a magnitude at and above the spin-flop value $B_{SF}$, by tuning the thickness of the storage anti-parallel coupling layer 232.

A read operation can then be performed for reading the written state levels. During the read operation, a read current 32 is selectively passed through the magnetic tunnel junction 2 via the first current line 4, for example by setting the selection transistor in the saturated mode, to measure a junction resistance ($R_{MTJ}$) of the magnetic tunnel junction 2. The resistance state can be determined by comparing the measured junction resistance ($R_{MTJ}$) with a reference resistance measured for a reference MRAM cell (not represented).

Figure 7:
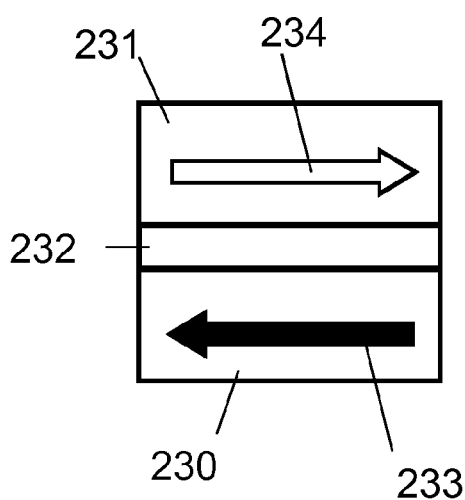
FIGS. 7 and 8 represent a schematic cross-section of the storage layer viewed from the side (FIG. 7) and from top (FIG. 8), according to another embodiment.
Figure 8:
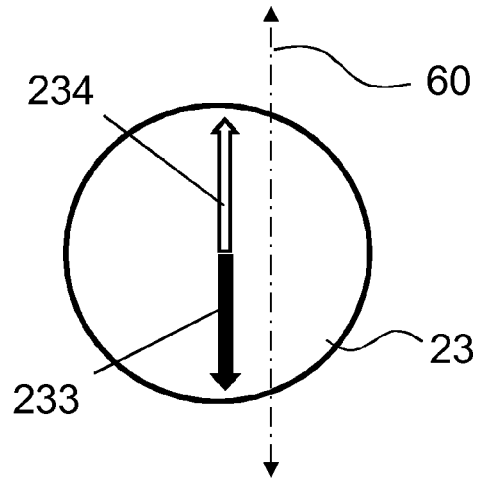

In another embodiment represented in FIGS. 7 to 11, the magnetic field 42 is applied substantially orthogonal with the anisotropy axis 60 of SAF storage layer 23, while the magnetic tunnel junction 2 is heated at the predetermined high temperature threshold. More particularly, FIGS. 7 and 8 represent a schematic cross-section of the SAF layer 23 with the first and second storage ferromagnetic layer 230, 231 viewed from the side (FIG. 7) and from top (FIG. 8), according to the present embodiment. The first storage magnetization 233 is represented antiparallel with the second storage magnetization 234 due to the coupling of the two storage magnetizations 233, 234 through the storage anti-parallel coupling layer 232, the first and second storage magnetization 233, 234 being aligned substantially parallel with a first anisotropy axis 60.

Figure 11:
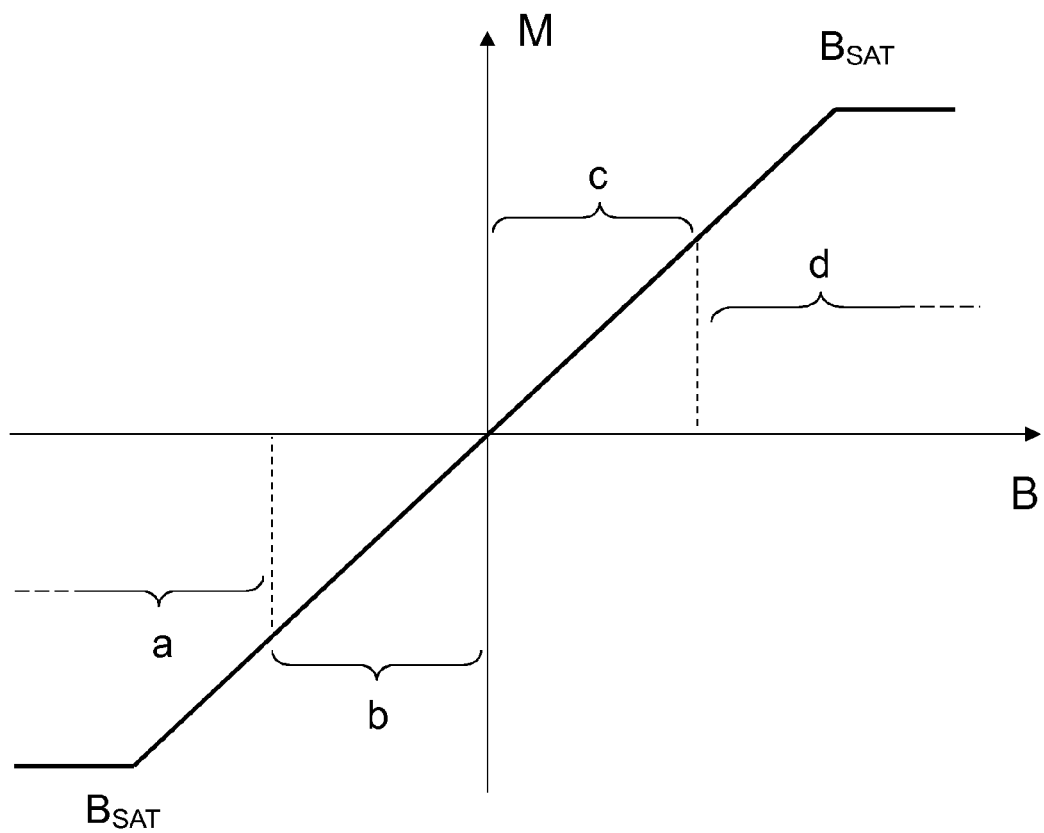
FIG. 11 represents a magnetization curve of the storage layer according to another embodiment.

In the case the magnetic field 42 is applied substantially orthogonal with the anisotropy axis 60, the corresponding magnetization curve shown in FIG. 11 does not show an opening of the hysteresis loop and the sudden net rise in the magnetization M as in the magnetization curve of FIG. 6. Instead, the magnetization M varies linearly with the magnitude B of the applied field 42 until the applied field 42 reaches the saturation magnetic field $H_{SAT}$.

The arrangements of the first and second storage magnetization 233, 234 when applying the external magnetic field 42 is represented in FIGS. 9a to 9d. FIGS. 10a to 10d illustrate arrangements of the first and second storage magnetization 233, 234 after the magnetic tunnel junction 2 has been cooled to the low temperature threshold and in the absence of the applied external magnetic field 42.

Figure 9:
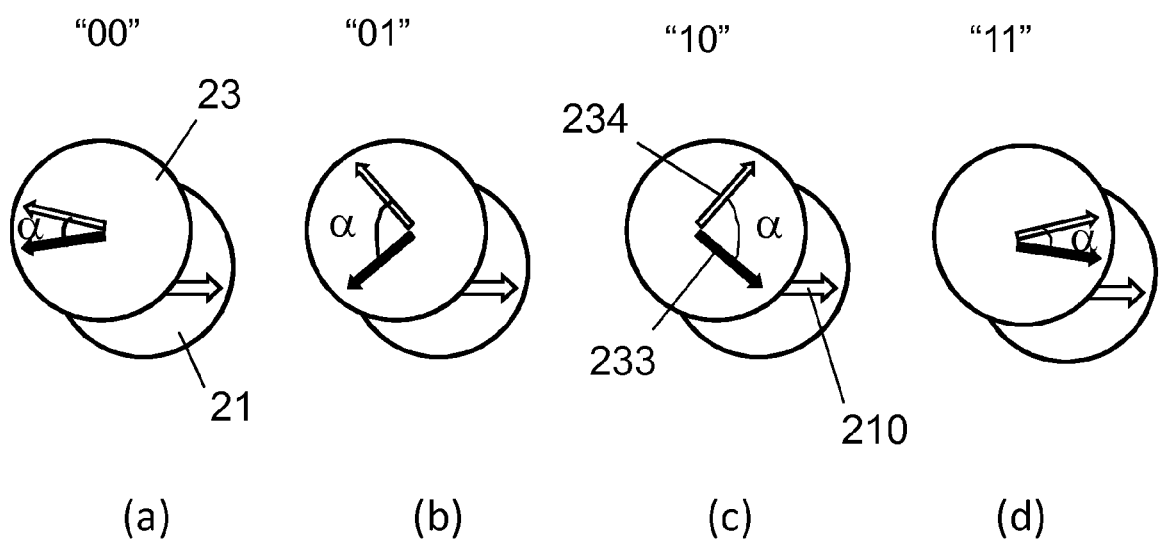
FIGS. 9a to 9d illustrate arrangements of the first and second storage layers in the presence of an external magnetic field and when heating the magnetic tunnel junction, according to another embodiment.
Figure 10:
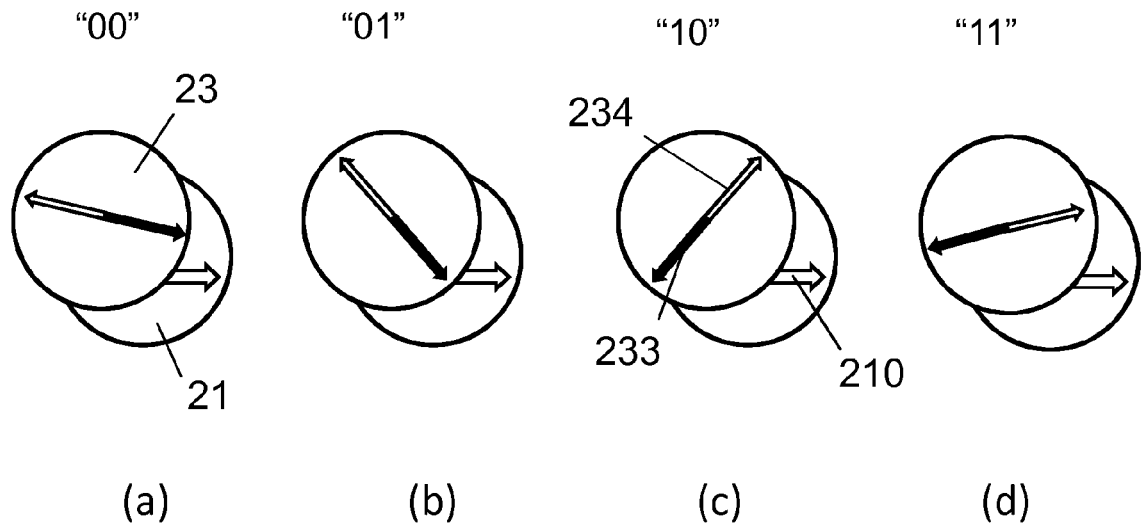
FIGS. 10a to 10d illustrate arrangements of the first and second storage magnetization in the absence of the magnetic field and after cooling the magnetic tunnel junction, according to another embodiment.

More particularly, in FIGS. 9a and 9b, the magnetic field 42 is applied in a direction opposed to the one of the read magnetization 210 (toward the left on FIG. 9). The second storage magnetization 234 is moved downward under the action of the magnetic field 42 from its initial upward position along the second anisotropy axis 60. The first storage magnetization 233 is moved upward from its initial downward position, such that the first storage magnetization 233 makes an angle α with the second storage magnetization 234.

The value of the angle α decreases when increasing the magnitude of the applied magnetic field 42. In FIG. 9a, the magnitude of the magnetic field 42 is higher than the one in FIG. 9b and the resulting angle α between the first and second storage magnetization 233, 234 is also smaller. In FIG. 9a, the first storage magnetization 233 becomes almost antiparallel with the read magnetization 210. The first and second storage magnetization 233, 234 substantially antiparallel with the read magnetization 210 can be obtained when the applied field 42 has a magnitude corresponding to the saturation value $B_{SAT}$.

After cooling the magnetic tunnel junction 2 to the low temperature threshold and in the absence of the applied external magnetic field 42, the first storage magnetization 233 becomes oriented substantially antiparallel with the second storage magnetization 234 (FIGS. 10a and 10b) and forms an angle α/2 with the read magnetization 210. In the configuration of FIG. 10a, the angle α/2 is small (almost parallel with the read magnetization 210) resulting in a low value of the magnetoresistance of the tunnel magnetic junction 2, corresponding to a first state level indicated by the numeral "00" in FIG. 10a. The configuration of FIG. 10b yields a first intermediate value of the magnetoresistance of the tunnel magnetic junction 2 and to a second state level indicated by the numeral "01".

In FIGS. 9c and 9d, the magnetic field 42 is applied substantially in a direction opposed to the one of FIGS. 9a and 9b, such that the first and second storage magnetization 233, 234 are oriented toward the read magnetization 210. After cooling the magnetic tunnel junction 2 to the low temperature threshold and in the absence of the applied external magnetic field 42, the first storage magnetization 233 becomes oriented at an angle of 180°−α/2 with the read magnetization 210. This results in a second intermediate value of the magnetoresistance of the tunnel magnetic junction 2 and to a third state level indicated by the numeral "10". In FIG. 10d, the value of angle of 180°−α/2 is such that the first storage magnetization 233 becomes oriented almost antiparallel with the read magnetization 210, resulting in a high value of the magnetoresistance of the tunnel magnetic junction 2 and to a fourth state level indicated by the numeral "11".

In fact, in the embodiment of FIGS. 7 to 11, where the magnetic field 42 is applied substantially orthogonal with the anisotropy axis 60, the value of the angle α angle between the first and second storage magnetization 233, 234 decreases continuously with increasing the magnitude of the applied magnetic field 42 until the magnitude of the magnetic field 42 reaches the saturation value $B_{SAT}$ where the first and second storage magnetization 233, 234 are substantially parallel and oriented in the same direction.

Figure 12:
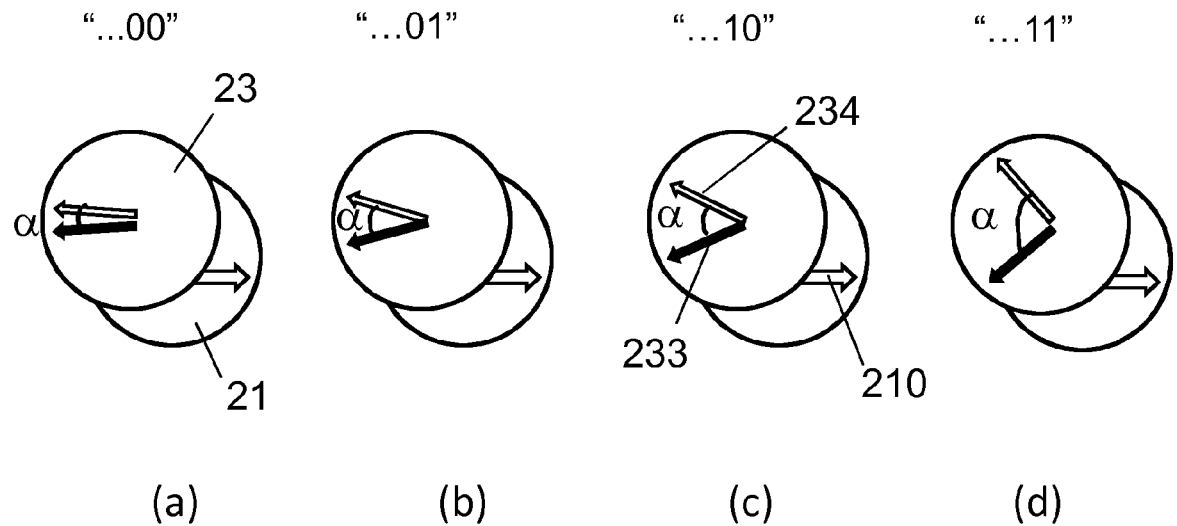
FIGS. 12a to 12d illustrate arrangements of the first and second storage layers in the presence of an external magnetic field and when heating the magnetic tunnel junction, according to yet another embodiment.
Figure 14:
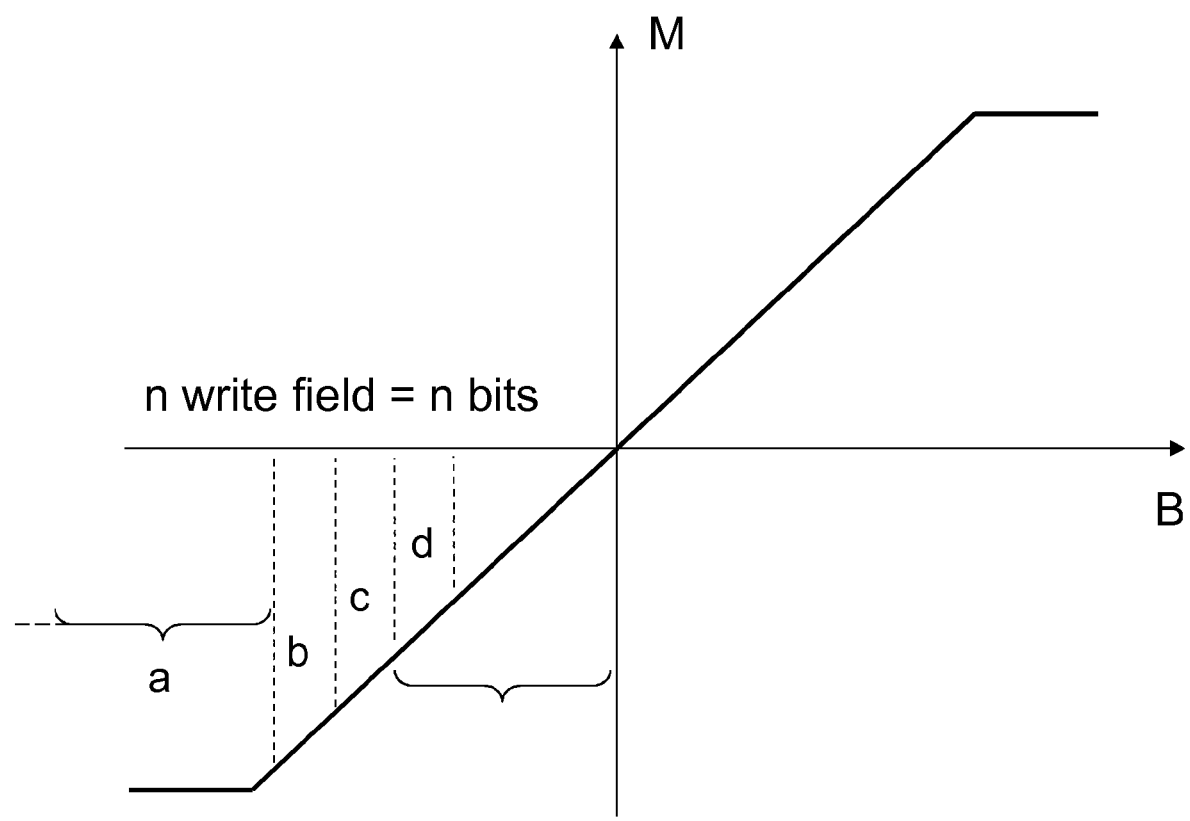
FIG. 14 represents a magnetization curve of the storage layer according to yet another embodiment.

This is illustrated in the embodiment of FIGS. 12a to 12d, where several arrangements of the first and second storage magnetization 233, 234 are obtained when the magnetic field 42 is applied oriented toward the left in FIG. 12, and with increasing magnitude corresponding to the portions (a) to (d) of the of magnetization curve shown in FIG. 14.

More particularly, the angle α between the first and second storage magnetization 233, 234 varies from a value close to 0° when the magnetic field 42 is applied at the saturation value $B_{SAT}$ (portion "a" of magnetization curve of FIG. 11) to a value close to 180° when the magnetic field 42 is applied at a magnitude close to zero. FIGS. 12a to 12d show the configurations where the angle α between the first and second storage magnetization 233 234 increases with the decreasing magnetic field 42 as shown by the portions (b) to (d) of the magnetization curve of FIG. 14, respectively. FIGS. 13a to 13d illustrate arrangements of the first and second storage magnetization 233, 234 after the magnetic tunnel junction 2 has been cooled to the low temperature threshold and in the absence of the applied external magnetic field 42.

Figure 13:
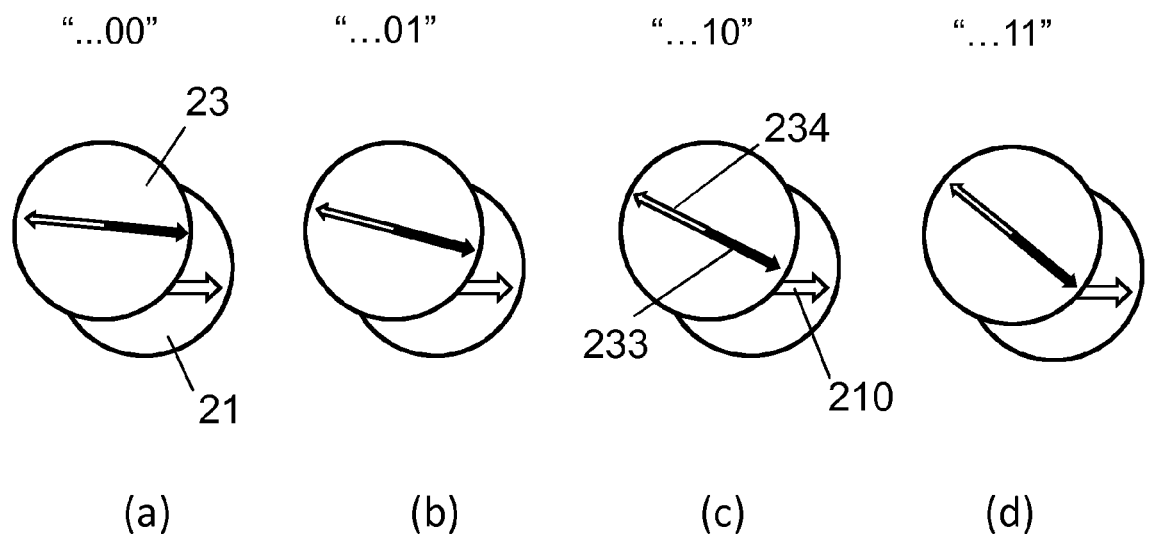
FIGS. 13a to 13d illustrate arrangements of the first and second storage magnetization in the absence of the magnetic field and after cooling the magnetic tunnel junction, according to yet another embodiment.

In FIG. 13a, the first storage magnetization 233 is oriented almost parallel to the read magnetization 210 corresponding to the low value of the magnetoresistance of the tunnel magnetic junction 2 and to the first state level indicated by the numeral "00". As shown in FIGS. 13a to 13d, the increasing angle α/2 between the first storage magnetization 233 and the read magnetization 210 corresponds to the four different state levels indicated by the numeral "01, "10" and "11". According to the embodiment of FIGS. 12 to 14, the magnetic tunnel junction 2 can thus be written with a plurality of state levels by varying the magnitude of the applied magnetic field 42 from the saturation value $B_{SAT}$ and below, along the corresponding magnetization curve.

The slope of the magnetization curve of FIG. 14 can be varied by varying the magnetic coupling between the first and second storage magnetization 233, 234. This can be achieved by varying the thickness of the storage anti-parallel coupling layer 232 or/and by modifying the material and thicknesses of the first and second storage ferromagnetic layer 230, 231. For example, a magnetization curve with a steeper slope can be obtained by increasing the thicknesses of the first and second storage layers 230, 231. The magnetization curve of FIG. 14 having a steep slope allows for larger increments of resistance in the different applied magnetic field 42, such that the writing of the different state levels can be made with smaller magnetic field 42.

In another embodiment not represented, the read layer 21 is made of a low coercivity, soft ferromagnetic material. The ferromagnetic materials include typically iron, cobalt nickel or their alloys. In contrast to the storage layer 23, the read layer 21 is not exchange biased and the read magnetization 210 has a direction that can be varied freely, for example, due to thermal agitation and thus, its magnetization can be freely aligned in a magnetic field.

Here, the read operation can be based on a self-referenced read operation as described in patent application EP2276034 by the present applicant. More particularly, the read operation can comprise, in a first read cycle, passing a first read field current having a first polarity in the second current line 5 (or possible the first current line 4). The first read field current induces a first read magnetic field capable of aligning the read magnetization 210 in a first aligned magnetization direction according to the first polarity of the first read field current. The first aligned magnetization direction of the read layer 21 is then compared with the written state level by passing the read current though the magnetic tunnel junction 2 via the current line 4, such as to measure a first junction resistance $R_1$ of the magnetic tunnel junction 2.

Such self-referenced read operation further comprises a second read cycle, comprising passing a second read field current having a second polarity in the second current line 5 (or first current line 4), such as to induce a second read magnetic field capable of aligning the read magnetization 210 in a second aligned magnetization direction according to the second polarity of the second read field current. The second aligned magnetization direction of the read layer 21 is then compared with the written state level by passing the read current though the magnetic current junction 2 via the current line 4, such as to measure a second junction resistance $R_2$ of the magnetic tunnel junction 2. The written state level can then be determined by determining a difference between the first and second resistance value $R_1$, $R_2$.

In another embodiment not represented, the first read current has an alternating polarity and induces an alternating first read magnetic field aligning the read magnetization 210 alternatively, in accordance to the alternating polarity of the first read current. Preferably, the alternating first read current aligns alternatively the read magnetization 210 without switching completely its magnetization. Consequently, the measured first resistance value $R_1$ varies alternatively with the varying read magnetization 210 and the written state level can be determined by comparing the varying first resistance value $R_1$ with the alternating first read current.

REFERENCE NUMBERS AND SYMBOLS

1 MRAM cell
2 magnetic tunnel junction
21 read layer
22 tunnel barrier layer
23 storage layer, SAF storage layer
210 read magnetization
230 first storage ferromagnetic layer
231 second storage ferromagnetic layer
232 storage anti-parallel coupling layer
233 first storage magnetization
234 second storage magnetization
24 antiferromagnetic storage layer
25 antiferromagnetic read layer
4 first current line
31 heating current
32 read current
5 second current line
41 field current
42 external magnetic field
60 anisotropy axis
α angle
B value of the external magnetic field
$B_{SAT}$ saturation value of the external magnetic field
$B_{SF}$ spin-flop value of the external magnetic field
M resulting magnetization

The invention claimed is:

1. Method for writing and reading more than two data bits to a magnetic random access memory (MRAM) cell comprising
   a magnetic tunnel junction formed from a read magnetic layer having a read magnetization, a tunnel barrier layer, and a storage layer;
   the storage layer that can be freely oriented at a high temperature threshold comprising a first storage ferromagnetic layer having a first storage magnetization, a second storage ferromagnetic layer having a second storage magnetization, and a storage anti-parallel coupling layer magnetically coupling the first and second storage magnetization; the method comprising:
   heating the magnetic tunnel junction to the high temperature threshold;
   orienting the first and second storage magnetization; and
   cooling the magnetic tunnel junction to a low temperature threshold to freeze the second storage magnetization;
   said orienting the first and second storage magnetization comprises the first storage magnetization forming a predetermined angle with respect to the second storage magnetization such as to reach a predetermined state resistance level of the magnetic tunnel junction determined by the orientation of the first storage magnetization relative to the read magnetization; and in that cooling the magnetic tunnel junction comprises freezing the second storage magnetization at the predetermined angle.

2. The method according to claim 1, wherein orienting the first and second storage magnetization comprises applying an external magnetic field, the predetermined angle being determined according to the magnitude and direction of the magnetic field.

3. The method according to claim 2, wherein applying an external magnetic field is performed substantially parallel to the anisotropy axis of the first and second storage magnetization.

4. The method according to claim 3, wherein said magnitude of the magnetic field is below a spin-flop value, or equal or exceeding the spin-flop value.

5. The method according to claim 2, wherein applying an external magnetic field is performed substantially orthogonal to the anisotropy axis of the first and second storage magnetization.

6. The method according to claim 5, wherein said magnitude of the magnetic field is varied from a saturation value of the first and second storage magnetization, and below.

7. The method according to claim 1, wherein the magnetic tunnel junction further comprises an antiferromagnetic storage layer adapted to pin the second storage magnetization at the low temperature threshold.

8. The method according to claim 1, wherein the read magnetization of the read layer is fixed relative to the storage magnetization direction; and further comprising passing a read current through the magnetic tunnel junction to measure a junction resistance of the magnetic tunnel junction.

9. The method according to claim 8, wherein the magnetic tunnel junction further comprises an antiferromagnetic read layer pinning the read magnetization.

10. The method according to claim 1, wherein the read magnetization of the read layer has a direction that can be varied freely; the method further comprising aligning the read magnetization in a first aligned direction such as to measure a first junction resistance of the magnetic tunnel junction; aligning the read magnetization in a second aligned direction such as to measure a second junction resistance of the magnetic tunnel junction; and determining a difference between the first and second junction resistance.

11. The method according to claim 10, wherein aligning the read magnetization in a first aligned direction comprises passing a first read current having a first polarity in the current line; and aligning the read magnetization in a second aligned direction comprises passing a second read current having a second polarity in the current line.

12. The method according to claim 1, wherein the first storage ferromagnetic layer and the second storage ferromagnetic layer are made from a CoFe, CoFeB or NiFe alloy and the storage anti-parallel coupling layer is made from a non-magnetic layer with material selected from a group consisting of ruthenium, chromium, rhenium, iridium, rhodium, silver, copper and yttrium.

13. The method according to claim 1, wherein the first and second storage ferromagnetic layer has a thickness comprised between about 1.5 nm and about 4 nm.

14. The method according to claim 1, wherein the storage anti-parallel coupling layer is made of ruthenium and has a thickness comprised between about 0.6 nm and about 2 nm, preferably between about 0.6 nm and about 0.9 nm or between about 1.6 nm and about 2 nm.

15. The method according to claim 6, wherein the saturation value of the first and second storage magnetization is varied by varying thickness of the storage anti-parallel coupling layer or by varying thickness of the first and second storage layer.

* * * * *